United States Patent
Hattori et al.

[11] Patent Number: 5,385,116
[45] Date of Patent: Jan. 31, 1995

[54] METHOD FOR PRODUCING ORGANIC CRYSTAL FILM

[75] Inventors: Yasuhiro Hattori; Akira Mizoguchi; Michiru Kubata, all of Osaka, Japan

[73] Assignee: Sumitomo Electric Industries, Ltd., Osaka, Japan

[21] Appl. No.: 35,704

[22] Filed: Mar. 23, 1993

[30] Foreign Application Priority Data

Mar. 24, 1992 [JP] Japan ................ 4-066164
Nov. 9, 1992 [JP] Japan ................ 4-298818

[51] Int. Cl.6 .................................... C30B 29/54
[52] U.S. Cl. .................................... 117/5; 117/59; 117/63; 117/902; 117/919
[58] Field of Search ..... 156/624, DIG. 65, DIG. 113; 117/5, 59, 63, 902, 919

[56] References Cited

U.S. PATENT DOCUMENTS

| | | | |
|---|---|---|---|
| 4,220,747 | 9/1980 | Preziosi et al. | 156/DIG. 65 |
| 4,684,434 | 8/1987 | Thakur et al. | 156/624 |
| 4,793,893 | 12/1988 | Thakur et al. | 156/624 |

FOREIGN PATENT DOCUMENTS

| | | |
|---|---|---|
| 0065691 | 12/1982 | European Pat. Off. |
| 0299384 | 1/1989 | European Pat. Off. |
| 0028833 | 1/1990 | Japan |
| 2160697 | 6/1990 | Japan |
| 359036 | 3/1991 | Japan |
| 0359036 | 3/1991 | Japan |
| 0412332 | 1/1992 | Japan |

OTHER PUBLICATIONS

"Structural characterization of oriented polyacetylene films grown by the liquid crystal method"; Coustel, et al; Macromolecules, 24(21) pp. 5867-5873.

"Polarized resonance Raman spectroscopy of fully-oriented crystalline trans-(CH)x."; Leising, et al; Synthetic Metals (Aug. 1985) vol. 11, No. 3 pp. 123-128.

*J. Chem. Phys.*, vol. 88; LeMoigne et al. (1988); pp. 6647-6654.

"Morphology, liner & nonlinear optical studies of poly[1,6-di(N-carbazolyl)-2,4 hexadiyne] thin films (pDCH)" *Appl. Phys. Lett.;* vol. 54; Kanatake et al; (1989); pp. 2287-2293.

"Nonlinear optical properties of highly oriented polydiacetylene evaporated films" *Macromolecules;* vol. 18; Thakur et al. (1955).

*Appl. Phys. Lett.,* vol. 59; Iwasa et al; (1991); "Nonlinear optical study of quasi-one-dimentional platinum complexes: Two-photon excitonic resonance effect"; pp. 2219-2221.

*IEEE Photo Tech. Letter;* vol. 3; Suhara et al; "Growth of Metanitroaniline Film Crystal with Controlled Orientation for Optical Waveguide Second-Harmonic Generation"; (1991); pp. 241-243.

Database Japio, No. 2-008 823, Japan Patent Information Organization, Tokyo, JP & JP-A-2-008 823 (Matsushita Electric Ind. Co. Ltd.) Dec. 1, 1990 "Abstract".

*Primary Examiner*—R. Bruce Breneman
*Assistant Examiner*—Felisa Garrett
*Attorney, Agent, or Firm*—Sughrue, Mion, Zinn, Macpeak & Seas

[57] ABSTRACT

A method for producing a crystal film of an organic compound from a molten liquid or solution of the organic compound on a substrate or between a pair of substrates, the substrate or at least one of the pair of substrates having on a part of the surface thereof a three-dimensional geometrical structure capable of controlling the direction of the crystal growth of the organic compound, and the other part of the surface thereof than the part having a three-dimensional geometrical structure being smooth. The resulting crystal film comprises a sufficiently large single crystal for application to a practical element with its orientation controlled in an arbitrarily selected direction.

10 Claims, 5 Drawing Sheets

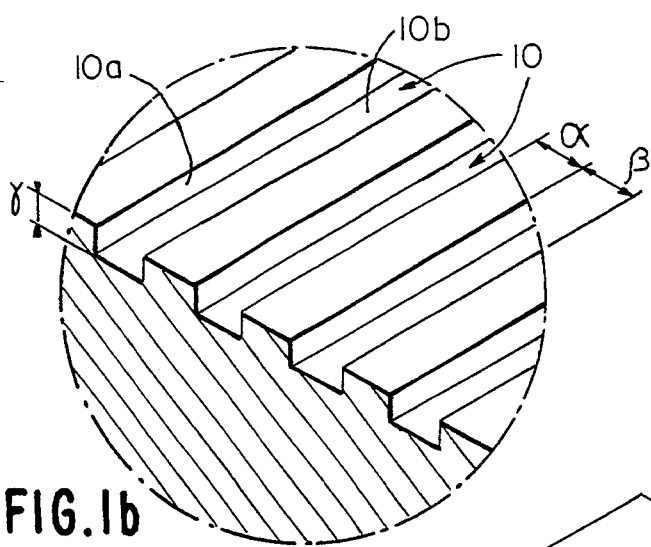
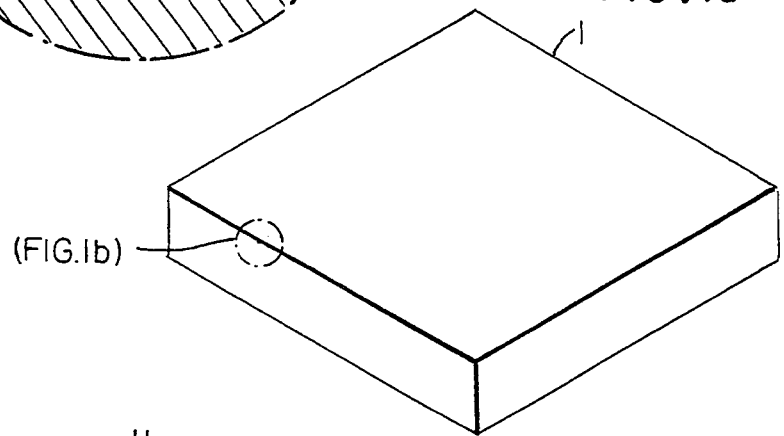
FIG.1b  FIG.1a
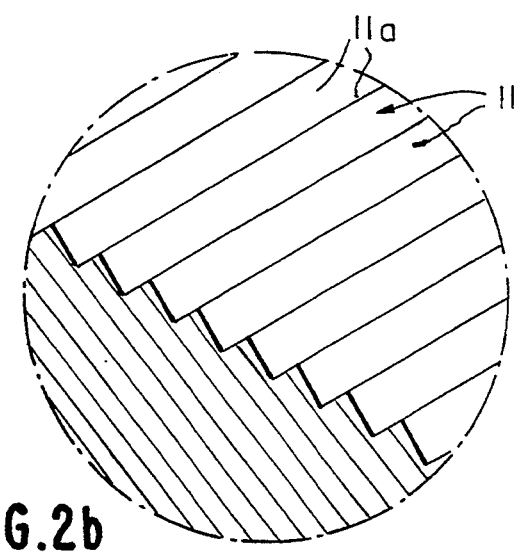
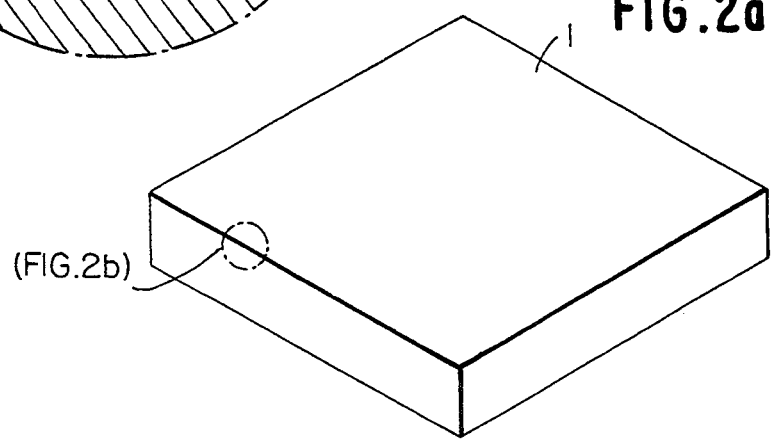
FIG.2b  FIG.2a

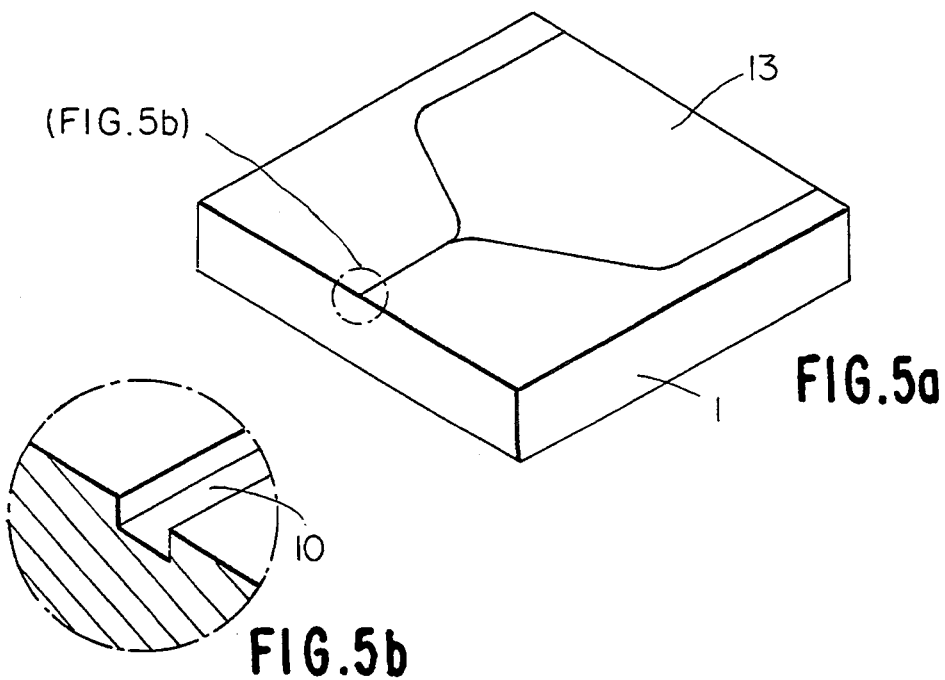
FIG.5a
FIG.5b
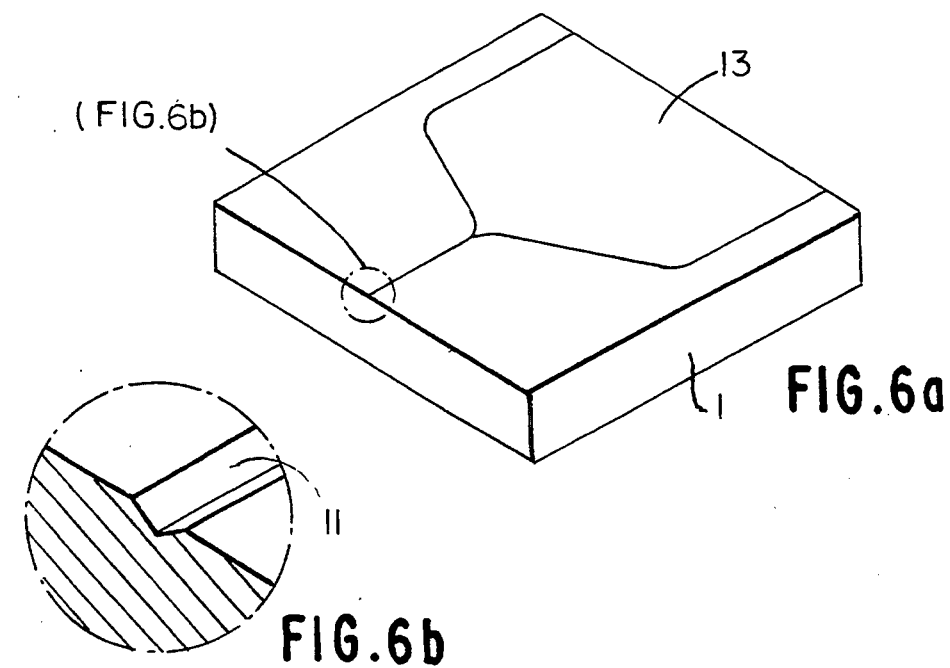
FIG.6a
FIG.6b

METHOD FOR PRODUCING ORGANIC CRYSTAL FILM

FIELD OF THE INVENTION

This invention relates to a method for producing an organic crystal thin film comprising a functional organic compound, such as a highly conductive material, a PHB material, a photochromic material, and an organic nonlinear optical material, on a substrate or between a pair of substrates.

BACKGROUND OF THE INVENTION

Of functional organic compounds as exemplified above, organic high polymers, such as polyacetylene and polydiacetylene, have recently attracting attention. In particular, polydiacetylene series organic polymers (hereinafter referred to as "PDA organic polymers") comprising a repeating unit of formula (I) shown below turned out to have excellent electrical and optical characteristics, and intensive studies on their practical application have been made. An optical element utilizing the cubic nonlinear properties is one of the important application field of the above organic compounds. A thin film type waveguide element attracts attention as the most practical application of such an element.

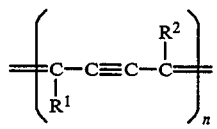
(I)

In order to use organic compounds such as PDA as an optical element, it is important to produce an organic compound film having less light scattering and a size sufficient to form the optical element. It is therefore necessary to manufacture an organic crystal film of a single crystal, which has less light scattering than polycrystals, on a smooth surface of a substrate having no unevenness which is a cause of light scattering.

PDA organic polymers have great anisotropic characteristics due to their cubic nonlinear optical characteristics on account of the $\pi$-electron conjugated system in the main chain direction and are therefore characterized by showing great functions in their main chain direction but no substantial function in the direction perpendicular to the main chain.

In the production of a PDA organic polymer film, it is necessary to control the orientation of the PDA main chain so that the resulting film may perform a function as desired because of the above-mentioned great anisotropy. However, PDA organic polymers have poor processability due to solvent insolubility and are therefore difficult to obtain in a thin film form while controlling the orientation as easy with general crystal materials.

Some of diacetylene monomers represented by formula (II):

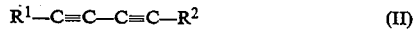
(II)

which are starting compounds for PDA organic polymers exhibit solid phase polymerizability. It is known that the crystals of such solid phase polymerizable diacetylene monomers are solid phase polymerized according to the following reaction formula by ultraviolet or $\gamma$-rays irradiation or by heating to form a crystal of an organic high polymer without involving a great change in crystal structure.

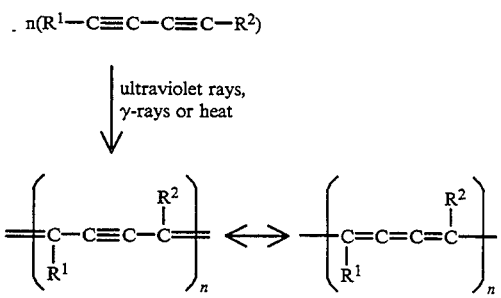

Several approaches to production of an oriented PDA organic polymer film by utilizing the solid phase polymerizability have been proposed, in which a diacetylene monomer crystal is first made to grow under orientation control to obtain a film, which is then subjected to solid phase polymerization to obtain an oriented PDA organic polymer film.

The above-mentioned production process of an oriented organic polymer film is also important as an application of other properties such as electrical conductivity.

In forming a film of an organic compound crystal, not being limited to an organic polymer, on a substrate, with utility of the film as an element being taken into consideration, the organic compound crystal is required to be oriented as unidirectionally as possible over a sufficient area for application as an element on a substrate having no surface evenness. For example, for an organic crystal film to be used as an element, the film is required to comprise a relatively large single crystal of the order of from several hundred microns to millimeters.

Among conventionally known orientation techniques is included an epitaxial growth method utilizing a molecular level interaction between a crystal substrate and an organic compound. In this method, since an organic compound shows crystal growth in the direction reflecting the symmetry of the substrate surface, it is necessary to use a substrate showing twofold symmetry for obtaining a unidirectionally oriented crystal film. The problem here is that crystal substrates whose surface has twofold symmetry are limited in kind and the organic compounds capable of epitaxy on such a substrate surface are also limited in kind.

J. Le Moigne, et al. reported a method comprising depositing a diacetylene monomer of formula (II) wherein $R^1$ and $R^2$ both represent a 9-carbazolyl group on a cleavage plane of a KBr single crystal by vacuum evaporation and then subjecting the deposit to solid phase polymerization to obtain a crystal film of a PDA organic polymer with controlled orientation of its main chain (PDA-DCHD) (see J. Chem. Phys., Vol. 88, p. 6647 (1988)). However, this method cannot be a complete success since the PDA main chain is not oriented unidirectionally but bidirectionally (crossing directions) due to fourfold symmetry of the cleavage plane of a KBr single crystal. Further, the resulting film has a polycrystalline structure, which is an aggregate of crystallites of several microns square, and cannot be applied to a practical element.

T. Kanetake, et al. reported preparation of a PDA crystal film having the PDA main chain oriented unidirectionally, which comprises depositing a diacetylene monomer on a glass substrate followed by solid phase polymerization, unidirectionally rubbing the surface of the resulting film with silicone cloth, etc., again depositing the same monomer thereon to obtain a unidirectionally oriented monomer crystal film, and solid phase polymerizing the deposited monomer (see Appl. Phys. Lett., Vol. 54, p. 2287 (1989)). In this case, also, the resulting film has a polycrystalline structure composed of several microns square crystallites and is not applicable to a practical element.

M. Thakur, et al. tried making a diacetylene monomer crystal in a molten or dissolved state to grow between a pair of smooth glass substrates while sliding the substrates in contact with each other in their plane direction to give a shear force to the surface of the substrates (see *Macromolecules*, Vol. 18, p. 2341 (1985)). According to the report, while a single crystal film reaching a millimeters square size can be obtained, the crystal growth direction cannot be controlled completely due to the use of an amorphous glass substrate.

JP-A-3-59036 (the term "JP-A" as used herein means an "unexamined published Japanese patent application") discloses a method for producing an organic compound crystal film comprising immersing, at a slant, a plurality of smooth substrates laid on each other via spacers in a solution of an organic compound for single crystal growth, and slowly evaporating the solvent to make the organic compound crystal grow between the substrates.

Y. Iwasa, et al. proposed a method for producing a platinum compound film comprising setting a silicone flat substrate at an angle of about 10°, and casting a solution of a platinum compound over the substrate from the upper end thereof simultaneously with evaporation of the solvent to make the crystal to grow (see *Appl. Phys. Lett.*, Vol. 59, p. 2219 (1991)).

According to these methods using a tilted substrate, a single crystal film of millimeters square size can be produced efficiently. However, these methods all involve the problem of incomplete control of the crystal growth direction due to the use of an amorphous substrate.

An attempt to achieve orientation control by a geometrical macrostructure of the surface of a substrate has been made by T. Suhara, et al. (see *IEEE photo. Tech. Letter.*, Vol. 3, p. 241 (1991)). The geometrical macrostructure used in this technique is composed of a pair of substrates having therebetween a pair or spacers parallel to the plane of the substrates, the pair of spacers forming a tapered recess therebetween, forming a groove area at one end which connects to a wide area at the other end. A molten liquid of mNA is fed to the groove, and the mNA crystal is made to grow starting from the groove area toward the wide area. A crystal film formed in the wide area shows crystal orientation controlled by the geometrically regulating force of the groove area.

In order to control the crystal orientation in this method, the groove width is required to be relatively small with respect to the crystal nucleus generated in the initial stage of crystal development. However, the groove in the above-mentioned technique is as wide as not less than 200 μm in width, and the materials which may be controlled in crystal orientation on the substrate of that shape are very limited.

JP-A-2-8823 discloses a method for crystal growth of a low molecular weight organic square nonlinear optical material by using a substrate having on the surface thereof grooves with a cyclic structure of a period of 3 μm or less. JP-A-4-12332 discloses a method for crystal growth of a low molecular weight compound by using a substrate having on the surface thereof irregular grooves formed by a diamond paste. However, the resulting organic crystal films of these methods have a problem in applying to an optical element since they are formed on the grooves.

SUMMARY OF THE INVENTION

An object of the present invention is to provide an efficient method for producing, on a substrate having a smooth surface with no unevenness, an organic crystal film comprising a large single crystal of the order of millimeters square with its orientation being controlled in an selected direction.

Other objects and effects of the present invention will be apparent from the following description.

The present invention relates to a method for producing a crystal film of an organic compound from a molten liquid or solution of the organic compound on a substrate or between a pair of substrates, the substrate or at least one of the pair of substrates having on a part of the surface thereof a three-dimensional geometrical structure capable of controlling the direction of the crystal growth of the organic compound, and the other part of the surface thereof than the part having a three-dimensional geometrical structure being smooth.

Where a crystal film is made to develop from a solution of an organic compound, it is preferable that the substrate with a three-dimensional geometrical structure on the surface thereof is tilted to control the crystal growth direction.

BRIEF DESCRIPTION OF THE DRAWINGS

FIG. 1 is a schematic view for explaining one example of a three-dimensional geometrical structure formed on the surface of a substrate.

FIG. 2 is a schematic view for explaining another example of a three-dimensional geometrical structure formed on the surface of a substrate.

FIG. 5 is a perspective view illustrating a still another example of the substrates having a three-dimensional geometrical structure on the surface thereof which can be used in the present invention.

FIG. 6 is a perspective view illustrating a further example of the substrates having a three-dimensional geometrical structure on the surface thereof which can be used in the present invention.

DETAILED DESCRIPTION OF THE INVENTION

The terminology "three-dimensional geometrical structure" which is formed on the surface of a substrate is a fine three-dimensional structure which influences on the growth of the organic crystal growing thereon to thereby control the orientation of the crystal growth.

Specific but non-limiting examples of such a three-dimensional geometrical structure include a groove grating structure comprising a number of grooves 10 having a rectangular section formed parallel on the surface of substrate 1 (shown in FIG. 1) and a groove grating structure comprising a number of grooves 11 having a triangular section formed parallel on the surface of substrate 1 (shown in FIG. 2). The pitch and depth of the grooves are not particularly limited and varies depending on the material of the organic crystal film. The pitch and depth is generally not more than several tens of microns, and preferably not more than 10 $\mu$m.

An organic crystal film having nonlinear optical characteristics is highly demanded because of its utility as a waveguide element with its refractive index matched. Since a film having grown on a substrate having a three-dimensional geometrical structure on the entire surface thereof unavoidably suffers light scattering and therefore may have a restricted waveguiding structure, it is necessary to use a substrate having a three-dimensional geometrical structure on a part of the surface thereof.

Figure 3B:
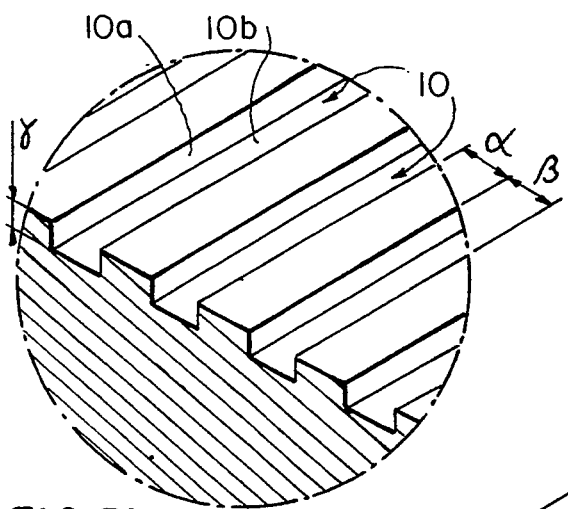
FIG. 3 is a perspective view illustrating one example of the substrates which can be used in the present invention, which has the same three-dimensional geometrical structure as in FIG. 1 on a half of its surface, with the other half having a smooth surface.
Figure 3C:
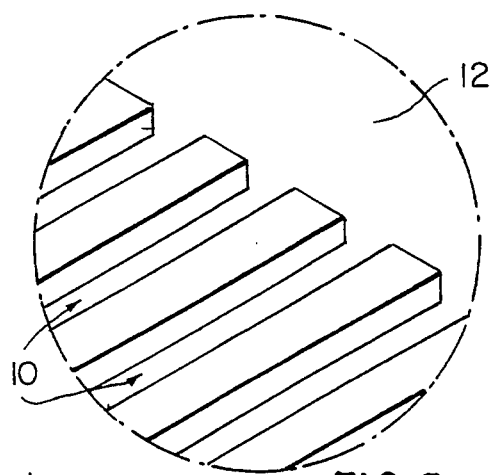
Figure 3A:
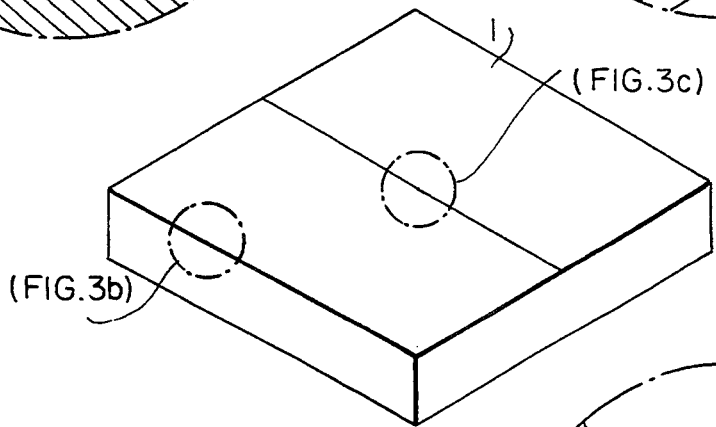
Figure 4B:
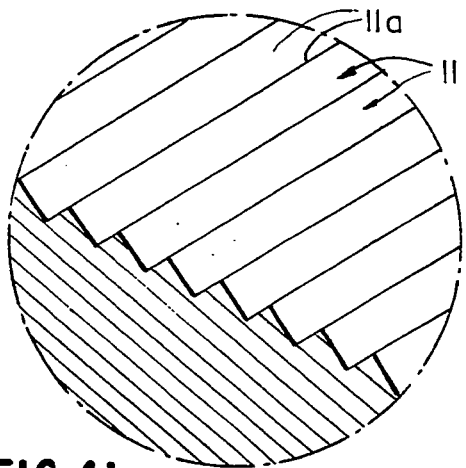
FIG. 4 is a perspective view illustrating another example of the substrates which can be used in the present invention, which has the same three-dimensional geometrical structure as in FIG. 2 on a half of its surface, with the other half having a smooth surface.
Figure 4C:
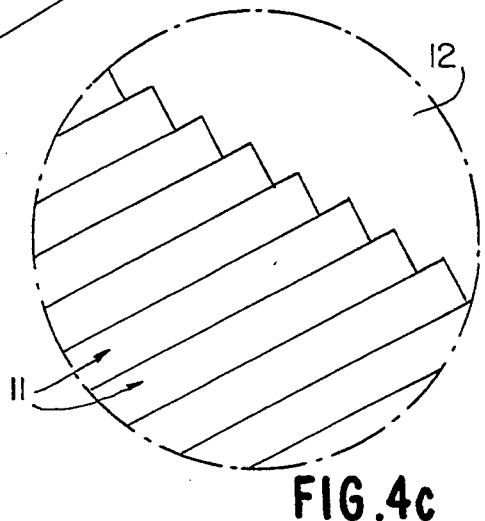
Figure 4A:
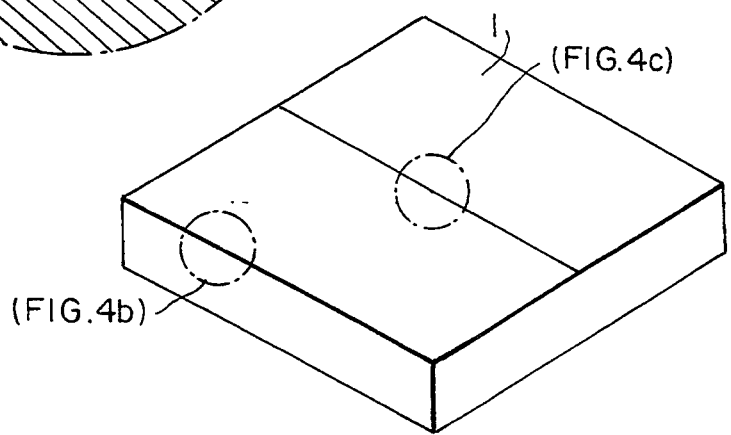

Examples of such a substrate include the substrate shown in FIG. 3 or 4 whose surface is composed of an area with grooves 10 or 11 and smooth area 12 with no grooves, and a substrate shown in FIG. 5 or 6 having at one end thereof groove 10 or 11 which is widened and connected to smooth area 13. The width of groove 10 or 11 is not particularly limited and varies depending on the material of the organic crystal film. The width is preferably not more than 10 $\mu$m. In the case where these substrates are used, an organic crystal first develops with its growth orientation controlled in the area of groove 10 or 11, which is then made to grow to smooth area 12 or 13. The organic crystal film formed on smooth area 12 or 13 can be used as an optical waveguide, etc.

The length of the grooved area in the substrate shown in FIG. 3 or 4 or the length of the groove in the substrate shown in FIG. 5 or 6 is not particularly limited and varies depending on the material of the organic crystal film. The length of the grooved area or the groove is preferably a length sufficient to control the direction of the crystal growth. The length of the smooth area in the substrate is also not particularly limited and varies depending on the material of the organic crystal film, and is preferably a length within which the direction of the crystal growth defined by the grooved area or the groove is not disturbed. The term "length" used herein means the dimension parallel to the grooves. The width of the grooved area and the smooth area, i.e., the dimension perpendicular to the grooves, is not essentially limited, and the present invention can be applied to substrates having any width. The width of the smooth area is preferably 1 mm or more in view of practical applications of the organic crystal film.

The shapes and the ratios of the surface having a three-dimensional geometrical structure and the smooth surface are not limited to the above embodiments.

The surface roughness of the smooth area is generally as small as enough not to occur light scattering, and preferably 50 nm or less in terms of root-mean-square roughness.

The organic crystal film having developed in the grooved area can be made to grow over smooth area 12 or 13 by providing a substrate with a temperature gradient at the time of crystal growth or providing an organic compound solution to be fed on the substrate with a concentration gradient. It is also effective to control the crystal growth direction by tilting the substrate as hereinafter described.

Where a monomer crystal film is formed between a pair of substrates, the above-mentioned three-dimensional geometrical structure may be formed on either one or both of the substrates. The distance between the pair of substrates is not particularly limited and varies depending on the material of the organic crystal film. The distance is generally within the range in which the effect of the three-dimensional geometrical structure is attained, and preferably 20 $\mu$m or less.

Figure 9:
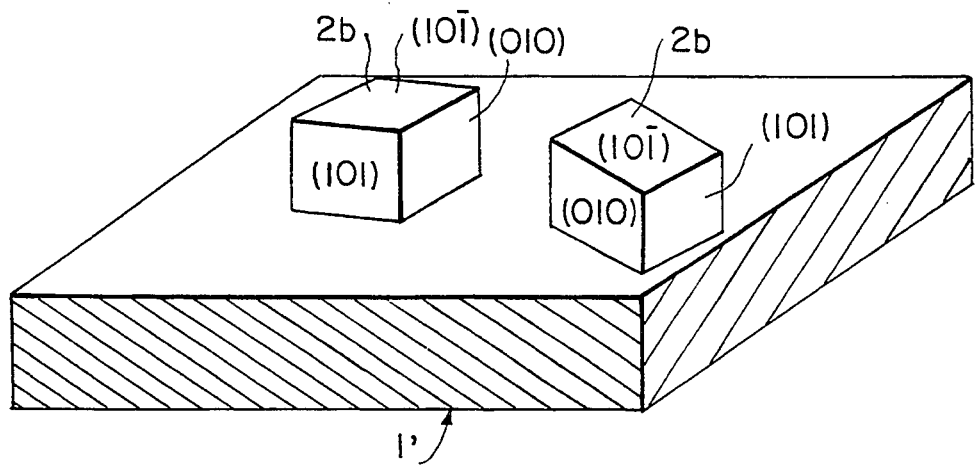
FIG. 9 is a perspective view illustrating crystal growth on a prior art substrate with no three-dimensional geometrical structure.

In general, when a liquid or a solid contacts a surface of another object, there is exerted an action for minimizing the interface energy. In other words, a liquid or a solid in contact with another object is restricted by the surface of the object. This also applies to crystal growth on the surface of a substrate, i.e., the orientation of a growing crystal is restricted by the substrate surface. This is explained by taking a case in which a diacetylene monomer of formula (II) wherein $R^1$ and $R^2$ both represent a 2,3,5,6-tetrafluoro-4-n-butylphenyl group (hereinafter described) is used as an organic compound and a silicon wafer (100), whose surface is covered with a very thin oxidized layer (surface oxide) and is thereby amorphous, is used as a substrate. Where the substrate has a smooth surface (substrate 1') as shown in FIG. 9, growing crystal 2b is subject to the restriction of the surface of substrate 1' and shows regular crystal growth in the vertical direction so that every crystal 2b has a crystal face (10$\bar{1}$) on its side parallel to the surface of substrate 1'. However, because the surface of substrate 1' has no anisotropy in its planar direction, every crystal 2b shows different orientation in the planar direction so that the crystal faces other than the above-mentioned face, i.e., (101) and (010), have directions differing among individual crystals 2b. Further, each crystal 2b freely rotates on the surface of substrate 1'. Therefore, the directions of neighboring crystals are never regulated, failing to join together in the course of their growth to grow into a large single crystal. As a result, the film formed on the substrate has a polycrystalline structure composed of crystallites and cannot be utilized as a practical element.

Figure 7:
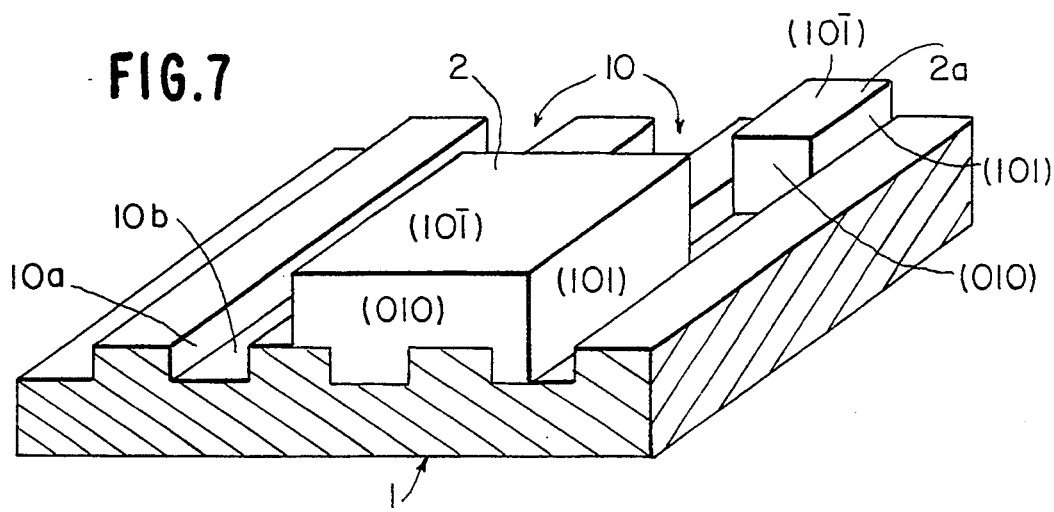
FIG. 7 is a perspective view illustrating crystal growth on the substrate of FIG. 1.

To the contrary, in the case where the substrate of FIG. 1 is used as shown in FIG. 7 with the organic compound and substrate material being the same, growing crystal 2a contacts both side 10a and bottom 10b of groove 10 and is therefore subject to the restriction of both side 10a and bottom 10b, which works to minimize the interfacial energy, so that crystal 2a grows along groove 10 with its face (101) substantially paralleling side 10a and its face (10$\bar{1}$) paralleling bottom 10b. Since every crystal 2a growing on substrate 1 has the same orientation direction. As a result, neighboring crystals 2a join together in the course of their growth to grow into large single crystal 2 extending over a wide area with its (10$\bar{1}$) face paralleling the surface of substrate 1.

Figure 8:
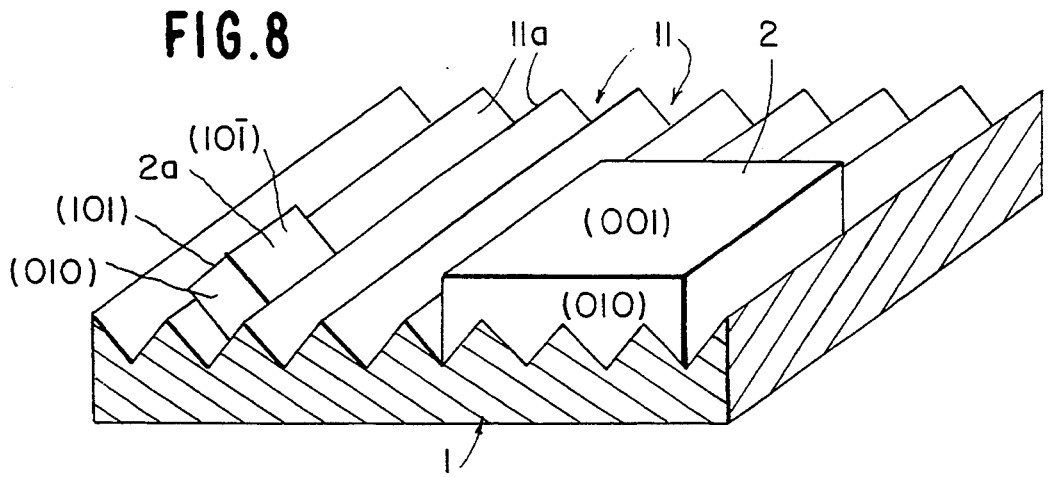
FIG. 8 is a perspective view illustrating crystal growth on the substrate of FIG. 2.

Similarly in the case where the substrate of FIG. 2 is used as shown in FIG. 8 with the organic compound and substrate material being the same, growing crystal 2a contacts both of pairing slanting sides 11a, 11a of groove 11 and is therefore subject to the restriction of both slanting sides 11a, 11a which works to minimize the interfacial energy, so that crystal 2a grows along groove 11 with its faces (10$\bar{1}$) and (101) substantially paralleling slanting sides 11a, 11a. As a result, neighboring crystals 2a join together in the course of their growth to grow into large single crystal 2 extending over a wide area with its (001) face paralleling the surface of substrate 1.

As described above, according to the present invention, a single crystal film of an organic compound containing a large single crystal of the order of a millimeters square can be formed while arbitrarily controlling its orientation according to the three-dimensional geometrical structure formed on the substrate surface. Further, the single crystal film is then grown on the smooth surface while maintaining its orientation, and therefore a single crystal film of an organic compound can be formed on the smooth surface of the substrate. The present invention thus makes it possible to produce, on a smooth substrate, an organic crystal film comprising a sufficiently large single crystal of the order of a millimeters square for application to a practical element with its crystal orientation arbitrarily controlled.

The substrate which can be used in the present invention is not particularly limited and examples thereof includes amorphous substrates made of fused quartz, glass having a high refractive index, etc.; and single crystal substrates made of silicon, gallium-arsenic, an alkali halide, etc. Among these, a glass substrate is preferably used if the crystal film is used as an optical element, since the refractive index of the glass can relatively freely selected. The three-dimensional geometrical structure on the substrate can be formed by submicron processing techniques used in the production of LSI, such as photolithography.

The material of the organic crystal film which can be formed on substrate 1 include various known organic compounds having any function.

Examples of organic compounds providing nonlinear optical materials are 3-nitro-5-(N,N-dimethylamino)-acetanilide, 3-(N,N-dimethylamino)-aniline, N-(4'-methoxybenzoyl-4-cyanoaniline, N-methyl-N-(4-cyanophenyl)aminoacetonitrile, N-(4-cyanophenyl)aminoacetonitrile, 4-nitrobenzylidene-2,3-dimethylaniline, 4-nitrobenzylidene-2,4-dimethylaniline, 4-nitrobenzylidene-2,5-dimethylaniline, 4-nitrobenzylidene-3,4-dimethylaniline, 4-nitrobenzylidene-3,5-dimethylaniline, 4-nitrobenzylidene-2,4-dimethoxyaniline, 4-nitrobenzylidene-3,4,5-trimethoxyaniline, 3-nitrobenzylidene-3,4,5-trimethoxyaniline, 2-nitrobenzylidene-3,4,5-trimethoxyaniline, 3-nitrobenzylidene-2,3-dimethylaniline, 3-nitrobenzylidene-2,5-dimethylaniline, 3-nitrobenzylidene-3,5-dimethylaniline, 2-methyl-4-nitroaniline (MNA), 4-(N,N-dimethylamino)-3-acetamidonitrobenzene (DAN), 4,5-dimethyl-1,3-dithiol-2-ylidenecyanoacetate, 1,3-dithiol-2-ylidenecyanoacetate, N-(4-nitrophenyl)-(S)-prolinol (NPP), N-(5-nitro-2-pyridyl)-(S)-phenylalalinol (NPPA), 9-methylcarbazole-3-carboxaldehyde, 3-acetamino-4-methoxy-N-(4-nitrobenzylidene)aniline (MNBA), a perylene/7,7,8,8-tetracyanoquinodimethane (TCNQ) complex, and a pyrene/TCNQ complex.

Preferred examples of the organic compounds capable of providing a functional polymer by solid phase polymerization include monomers providing the above-mentioned PDA polymers excellent in electrical characteristics and optical characteristics. In addition, various monomers capable of solid phase polymerization to provide known functional organic polymers, such as polyacetylene, may also be used.

Of the monomers providing PDA type high polymers, those of formula (II) wherein $R^1$ and $R^2$ both represent a fluorine-containing substituent are preferred. In particular, a monomer of formula (II) wherein $R^1$ and $R^2$ both represent a 2,3,5,6-tetrafluoro-4-n-butylphenyl group represented by formula (III):

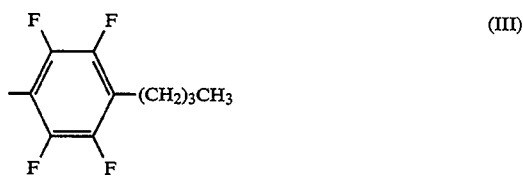

provides a polymer with excellent electrical and optical characteristics (hereinafter referred to as "PDA-BTFP").

Also preferred is a monomer of formula (II) wherein $R^1$ and $R^2$ both represent a carbazoylmethylene group represented by formula (IV):

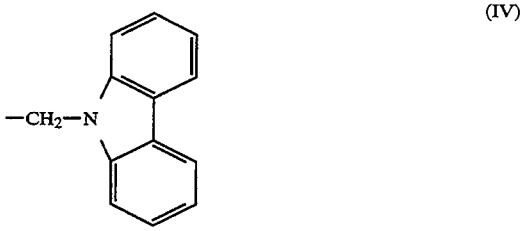

providing a polymer with excellent electrical and optical characteristics (hereinafter referred to as "PDA-DCHD"). PDA-DCHD has an additional advantage of heat polymerizability.

A method of solid phase polymerization is not particularly limited. For example, monomers for PDA organic polymer films can be solid-phase-polymerized by heat, γ-ray irradiation or ultraviolet irradiation.

A crystal film of the above-mentioned organic compound monomer can be formed by slowly cooling a molten liquid of the monomer fed on a substrate having thereon a three-dimensional geometrical structure or between a pair of substrates at least one of which has thereon a three-dimensional geometrical structure. For example, the substrate or the pair of substrates is uniformly slowly cooled or cooled from the end of the three-dimensional geometrical structure by withdrawing from a high temperature part, at a rate capable of attaining crystal growth from the molten liquid under the effect of the three-dimensional geometrical structure. A crystal film can also be formed by slowly evaporating a solvent of a solution of the monomer fed on the substrate or between the-pair of substrate.

Where a crystal is made to grow by solvent evaporation, control of the growth direction is preferably achieved by tilting the substrate(s). Tilting of a substrate is especially effective for crystal film formation on a substrate having a three-dimensional geometrical structure on a part of it and a smooth surface on the other part on which the crystal is grown from the area with the three-dimensional geometrical structure.

The solvent evaporation on a tilted substrate is classified into two further embodiments, (1) in one of which a solution of an organic compound is dripped on the upside end of the substrate and made to run down on the substrate surface while removing the solvent by evaporation, and (2) in the other of which a tilted substrate is dipped in a solution of an organic compound, and the solvent is removed by evaporation.

In the former embodiment (1), while the solution runs downstream, a crystal is formed from the upside with the solvent evaporation, and the crystal grows continuously toward the downside with the running solution. In this case, the individual crystallites in the individual grooves grow synchronously and with the same orientation so that the crystal growth point (the solution-crystal boundary where the solvent evaporation completes) makes a substantially straight line perpendicular to the solution running direction. This favors the crystallites to join-together, achieving high efficiency in producing a large oriented crystal film.

The optimal crystallization velocity for smooth growth into a large single crystal depends on the kind of the organic compound used. In the former embodiment, the crystallization velocity is decided by the running speed of the solution, and the running speed of the solution is decided by the slope of the tilted substrate and the viscosity of the solution. As the viscosity of the solution is unconditionally decided by the kind of the organic compound, the kind of the solvent, and the concentration, the running speed of the solution is preferably set within an optimal range by adjusting the slope of the substrate.

In the latter embodiment (2), according as the solvent evaporates to slowly lower the liquid level of the solution, a crystal begins to grow from the upside of the tilted substrate and continuously grows downward with the lowering liquid level. The crystal growth point agrees with the liquid level, making a horizontal straight light over the whole width of the substrate. Therefore, similarly to the former embodiment (1), the individual crystallites grow synchronously in the same orientation direction and easily join together to form a large oriented crystal film with good efficiency.

The present invention is now illustrated in greater detail with reference to Examples, but it should be understood that the present invention is not deemed to be limited thereto.

EXAMPLE 1

A 5 mm wide and 1 cm long silicon wafer (100) was used as a substrate. On one of the longitudinally divided halves of the substrate surface (a 5 mm×5 mm area) was formed a groove grating structure having a rectangular section (convex width ($\alpha$): 3 $\mu$m; concave width ($\beta$): 3 $\mu$m; depth ($\gamma$): 1 $\mu$m) in parallel to the longitudinal direction of the wafer as shown in FIG. 3. The other half of the wafer had a smooth surface. The wafer had a very thin surface oxide on both the grooved area and the smooth area and was therefor amorphous.

On the surface of the silicon wafer was put 0.1 mg of powder of a diacetylene monomer of formula (II) wherein $R^1$ and $R^2$ both represent a 2,3,5,6-tetrafluoro-4-n-butylphenyl group (III) (melting point: 104° C.) and was covered with a cover glass.

The silicon wafer was heated on a heater to a temperature of 120° C. (higher than the melting point of the monomer) in a nitrogen atmosphere while being shielded from light, whereupon the monomer was melted. The molten liquid was then slowly cooled to room temperature at a rate of 20° C./min to grow into a monomer crystal film between the silicon wafer and the cover glass.

Ultraviolet light of 254 nm was then irradiated on the crystal film to induce solid phase polymerization to form a crystal film of PDA-BTFP.

Figure 10:
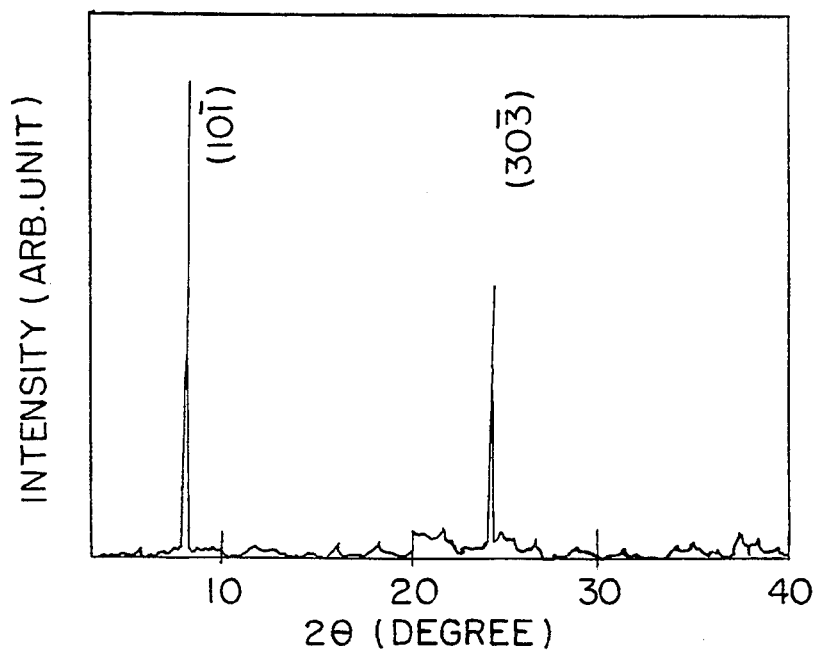
FIG. 10 is a reflective X-ray diffraction pattern of a polymer crystal film produced in Example 1.

In FIG. 10 is shown a reflective X-ray diffraction pattern of the PDA-BTFP crystal film resulting on the smooth surface. The diffraction pattern shows only peaks assigned to (h0$\bar{h}$) crystal faces, indicating that the crystal film formed on the smooth surface is a film resulting from selective growth in the direction parallel to the surface of the silicon wafer. It is expected from the crystal structure of PDA-BTFP that the b axis of the crystal, namely the PDA main chain, parallels the substrate.

Further, knowing that PDA-BTFP performs its function through the $\pi$-electron conjugated system in its main chain direction, that is, the dielectric main axis agrees with the PDA main chain, the PDA main chain direction was observed under a polarizing microscope. As a result, the PDA main chain direction was confirmed to be parallel to the groove grating on the smooth surface.

The size of the greatest single crystal in the film as observed under the polarizing microscope was about 1 mm×2 mm.

EXAMPLE 2

The same silicon wafer as in Example 1 was set at an angle of 5° from the horizon with the grooved area up and the groove grating paralleling the slant line.

About 15 mg of a 1 wt % chloroform solution of the same diacetylene monomer as used in Example 1 was dropped on the upside of the tilted wafer surface. While the solution was made to run downward, chloroform was evaporated over a period of at least 10 seconds up to 20 seconds to form a monomer crystal film on the wafer.

Ultraviolet light of 254 nm was then irradiated on the crystal film to induce solid phase polymerization to form a crystal film of PDA-BTFP.

Observation of the resulting PDA-BTFP crystal film under a polarizing microscope revealed that the crystal orientation is controlled over the entire surface of the silicon wafer inclusive of not only the grooved area but the smooth area and that the PDA main chain direction in the film formed even on the smooth area is parallel to the groove grating. The greatest single crystal as observed under the polarizing microscope had a size of about 3 mm×5 mm extending over both the grooved area and the smooth area.

EXAMPLE 3

The same grooved silicon wafer substrate as used in Example 1 was set at an angle of 30° from the horizon with the grooved area up and the groove grating paralleling the slant line. The wafer had a very thin surface oxide and was therefore amorphous.

About 15 mg of a 1 wt % cyclopentanone solution of a diacetylene monomer of formula (II) wherein $R^1$ and R² both represent a carbazoylmethylene group (IV) was dropped on the grooved upside of the tilted wafer surface. While the solution was made to run downward, cyclopentanone was evaporated over a period of from 15 to 20 minutes to make the monomer crystal grow on the wafer. The resulting crystal film was heated at 150° C. for 24 hours to form a crystal film of PDA-DCHD.

Figure 11:
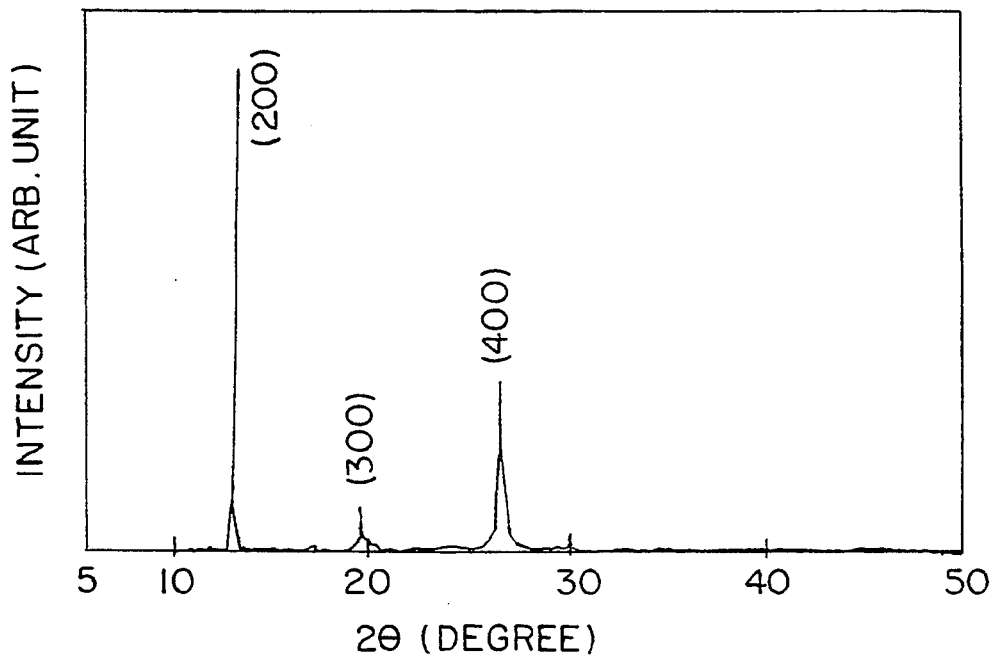
FIG. 11 is a reflective X-ray diffraction pattern of a high polymer crystal film produced in Example 3.

In FIG. 11 is shown a reflective X-ray diffraction pattern of the PDA-DCHD crystal film resulting on the smooth surface. The diffraction pattern shows only peaks assigned to (h00) crystal faces, indicating that the crystal film is a film resulting from selective growth of the (100) face in the direction parallel to the surface of the silicon wafer. The PDA main chain direction was confirmed to be parallel to the groove grating on the smooth surface under a polarizing microscope.

Further, the microscopic observation revealed that the crystal orientation is controlled over the entire surface of the 5 mm square silicon wafer and the greatest single crystal size was found to be about 2 mm×200 μm.

EXAMPLE 4

The same 5 mm×1 cm silicon wafer (100) with a groove grating structure as used in Example 1 was set at an angle of 45° from the horizon with the groove area u and the groove grating paralleling the slant line. The wafer was immersed in a 0.3 wt % acetone solution of 4-methoxy-3-acetamino-4'-nitrobenzylideneaniline (MNBA), and acetone was spontaneously evaporated at room temperature to form a crystal film of MNBA on the silicon wafer.

When observed under a polarizing microscope, all the crystals in the resulting MNBA crystal film formed on the smooth surface showed an extinction phenomenon when the polarizing direction agreed with the direction of the groove grating. From this it was confirmed that the MNBA crystal film has its orientation controlled over a wide area.

EXAMPLE 5

The same grooved silicon wafer substrate (5 mm×1 cm) as used in Example 1 was set at an angle of 45° from the horizon with the groove area up and the groove grating paralleling the slant line. The wafer was immersed in a 0.4 wt % acetone solution of a 1/1 complex of pyrene and 7,7,8,8-tetracyanoquinodimethane (TCNQ), and acetone was spontaneously evaporated at room temperature to form a pyrene-TCNQ complex crystal film on the silicon wafer.

When observed under a polarizing microscope, all the crystals of the resulting crystal film formed on the smooth surface within the area of about 1 mm×2 mm showed an extinction phenomenon when the polarizing direction agreed with the direction of the groove grating. From this it was confirmed that the crystal film has its orientation controlled over a wide area.

EXAMPLE 6

A 5 mm wide and 12.5 mm long silicon wafer (100) was used as a substrate. A three-dimensional geometrical structure shown in FIG. 5 was formed on the surface of the wafer, which comprised a single groove (width: 3 μm; depth: 1 μm) on one end of the major axis of the wafer which widened and connected with a wide smooth area. The wafer had a very thin surface oxide and was amorphous.

A cover glass was superposed on the surface of the silicon wafer and fixed to form a cell. A molten liquid of the same diacetylene monomer as used in Example 1 (melting point: 104° C.) was injected into the space between the silicon wafer and the cover glass by capillarity.

The cell containing the monomer molten liquid was put in a furnace kept at 110° C. to keep the monomer in a molten state, and it was slowly drawn out of the furnace from the end with the single groove at a speed of 1 mm/min. The monomer was thus cooled below the melting point from that end to grow into a monomer crystal film. Ultraviolet light of 254 nm was irradiated on the crystal film to induce solid phase polymerization to form a PDA-BTFP crystal film.

Observation of the resulting crystal film under a polarizing microscope revealed that the crystal orientation is controlled over the entire surface of the three-dimensional geometrical structure inclusive of not only the grooved area but the smooth area and that the direction of the PDA main chain is parallel to the groove in not only the grooved area but in the smooth area. The greatest single crystal as observed under the polarizing microscope had a size of about 3 mm×5 mm.

As described above, the present invention makes it possible to produce an organic crystal film comprising a sufficiently large single crystal having a size of 1 mm×1 mm or larger for application to a practical element with its crystal orientation arbitrarily controlled. The thus produced organic crystal film is applicable as, for example, a waveguide to provide an optical element, such as an optical switch, an optical memory, and is therefore greatly promising for application to the fields of optical communication, optical information processing and the like.

While the invention has been described in detail and with reference to specific examples thereof, it will be apparent to one skilled in the art that various changes and modifications can be made therein without departing from the spirit and scope thereof.

What is claimed is:

1. A method for producing a crystal film of an organic compound comprising the steps of:

contacting a molten liquid or a solution of an organic compound with a substrate or introducing said molten liquid or said solution between a pair of substrates, wherein said substrate or at least one of said pair of substrates has on part of its surface a three-dimensional geometrical structure and on the other part has a smooth surface, wherein said geometrical part is capable of controlling the direction of crystal growth of said organic compound, growing a crystal film from said molten liquid or said solution of said organic compound in contact with the surface of said geometrical part of said substrate in a direction toward said smooth part of said substrate, and extending the growth of said crystal film over said smooth part of said substrate.

2. A method as claimed in claim 1, wherein the three-dimensional geometrical structure is parallel grooves having a rectangular section.

3. A method as claimed in claim 1, wherein the three-dimensional geometrical structure is parallel grooves having a triangular section.

4. A method as claimed in claim 1, wherein the three-dimensional geometrical structure is parallel grooves having a rectangular section and the smooth part is positioned beyond the direction of the parallel grooves.

5. A method as claimed in claim 1, wherein the three-dimensional geometrical structure is parallel grooves having a triangular section and the smooth part is positioned beyond the direction of the parallel grooves.

6. A method as claimed in claim 1, wherein said crystal film is formed by using a solution of said organic compound, and said crystal film is grown in a direction from said geometrical part to said smooth part by tilting said substrate or at least one of said pair of substrates with said geometrical part upward, and evaporating a solvent contained in said solution from an upper side of the substrate.

7. A method as claimed in claim 1, wherein said crystal film is formed by using said molten liquid of said organic compound, and said crystal film is grown in a direction from said geometrical part to said smooth part by cooling said molten liquid, wherein said cooling of said motlen liquid begins at said geometrical part of said substrate and ends at said smooth part of said substrate.

8. A method as claimed in claim 1, wherein said organic compound is a monomer polymerizable in a solid phase, and said organic crystal film is further subjected to solid phase polymerization to produce a crystal film of an organic high polymer.

9. A method as claimed in claim 8, wherein said monomer is a diacetylene monomer.

10. A method as claimed in claim 9, wherein said diacetylene monomer is represented by formula (II):

$$R^1-C\equiv C-C\equiv C-R^2 \qquad (II)$$

wherein $R^1$ and $R^2$ both represent a substituent containing fluorine.

* * * * *